United States Patent
Kodama

(10) Patent No.: US 9,607,389 B2
(45) Date of Patent: Mar. 28, 2017

(54) ALIGNMENT APPARATUS

(71) Applicant: TOKYO ELECTRON LIMITED, Tokyo (JP)

(72) Inventor: Toshiaki Kodama, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/857,585

(22) Filed: Sep. 17, 2015

(65) Prior Publication Data

US 2016/0078612 A1   Mar. 17, 2016

(30) Foreign Application Priority Data

Sep. 17, 2014 (JP) ................................ 2014-188766

(51) Int. Cl.
*G06T 7/00* (2006.01)
*H01L 21/68* (2006.01)

(52) U.S. Cl.
CPC .......... *G06T 7/0044* (2013.01); *G06T 7/0028* (2013.01); *H01L 21/681* (2013.01); *G06T 2207/10152* (2013.01); *G06T 2207/30148* (2013.01); *G06T 2207/30204* (2013.01)

(58) Field of Classification Search
CPC .... G06T 7/0044; G06T 7/0028; H01L 21/681
See application file for complete search history.

(56) References Cited

U.S. PATENT DOCUMENTS

| | | | | |
|---|---|---|---|---|
| 5,493,403 A | * | 2/1996 | Nishi | G03F 9/70 356/401 |
| 2004/0042648 A1 | * | 3/2004 | Yoshidda | G06T 7/0044 382/151 |
| 2008/0013089 A1 | * | 1/2008 | Ishii | G03F 9/7011 356/400 |
| 2011/0149062 A1 | * | 6/2011 | Campidell | G01J 5/0003 348/87 |
| 2011/0199477 A1 | * | 8/2011 | Ravid | H01L 21/67253 348/87 |
| 2015/0287625 A1 | * | 10/2015 | Fujimoto | G01B 11/002 382/151 |

FOREIGN PATENT DOCUMENTS

JP      2009-88184      4/2009

* cited by examiner

*Primary Examiner* — David F Dunphy

(57) ABSTRACT

An alignment apparatus for aligning a wafer by optically detecting an alignment mark includes an imaging unit configured to image an imaging region extending across a circumferential edge of the wafer, an irradiation unit configured to irradiate light toward the imaging region, a reflection part configured to reflect toward the imaging region the light that is irradiated from the irradiation unit upwardly, and a control unit configured to detect the circumferential edge. The reflection part has a reflectance making a luminance difference between the outside of the wafer and the circumferential edge of the wafer in a luminance distribution pattern obtained by imaging the imaging region. The control unit detects the alignment mark and the circumferential edge based on the luminance distribution pattern.

8 Claims, 12 Drawing Sheets

ALIGNMENT APPARATUS

CROSS-REFERENCE TO RELATED APPLICATIONS

This application claims priority to Japanese Patent Application No. 2014-188766 filed on Sep. 17, 2014, the entire contents of which are incorporated herein by reference.

FIELD OF THE INVENTION

The disclosure relates to an alignment apparatus for aligning a wafer by detecting a circumferential edge of the wafer.

BACKGROUND OF THE INVENTION

In a semiconductor manufacturing apparatus, a semiconductor wafer (hereinafter, referred to as "wafer") that is a circular substrate is transferred to a processing module by a transfer unit and subjected to processing. Before the wafer is transferred to the processing module by the transfer unit, the wafer may be transferred to an alignment apparatus so that a direction and a position of a circumferential edge thereof can be detected. The transfer unit receives the wafer from the alignment apparatus, and transfers the wafer to a predetermined location in the processing module to be directed in a predetermined orientation based on the detection result.

Conventionally, a wafer has a cutoff portion referred to as a notch that indicates a orientation thereof. The alignment apparatus has a transmission-type sensor so that a orientation of the notch and a location of the circumferential edge of the wafer can be detected. However, a recent wafer having a diameter of 450 mm may have a fiducial mark (hereinafter, referred to as "alignment mark") that is a dot-shaped laser mark, instead of the notch, near a circumferential edge of a backside thereof. Accordingly, the alignment apparatus has a camera that is a reflective type sensor, and the alignment mark and the circumferential edge of the wafer are detected by imaging the wafer by the camera while a light source irradiates the wafer with light.

An slanted surface referred to as a beveled portion is formed at a top surface and a backside of a peripheral end portion of the wafer. As will be described in detail in "Detailed Description of the Embodiments", due to the beveled portion of the above shape, the reflection state of the light from the light source becomes different between the beveled portion of the wafer and a portion of the wafer located at an inner side than the beveled portion, which makes it difficult to accurately detect the circumferential edge of the wafer. Japanese Patent Application Publication No. 2009-88184 discloses a technique for obtaining an image including a contour of a wafer by a camera and obtaining a position of the wafer based on the image. However, there are not disclosed the above drawback and a solution.

SUMMARY OF THE INVENTION

The disclosure provides an alignment apparatus which is capable of detecting an alignment mark of a wafer and a circumferential edge of the wafer with high accuracy.

In accordance with an aspect, there is provided an alignment apparatus for aligning a wafer that is a circular substrate mounted on a mounting unit in a predetermined orientation by optically detecting an alignment mark formed at a backside of the wafer by rotating the mounting unit. The apparatus includes: an imaging unit configured to image, from a position below the wafer, an imaging region having a strip shape extending in a diametrical direction of the wafer across a circumferential edge of the wafer; an irradiation unit configured to irradiate light from a position below the wafer toward the imaging region; a reflection part configured to reflect toward the imaging region the light that is irradiated from the irradiation unit upwardly while passing through an outside of the wafer, the reflection part having a reflectance making a luminance difference between the outside of the wafer corresponding to the reflection part and the circumferential edge of the wafer in a luminance distribution pattern, obtained by imaging the imaging region, in the diametrical direction of the wafer; and a control unit configured to detect the alignment mark and the circumferential edge of the wafer based on the luminance distribution pattern.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

First Embodiment

Figure 1:
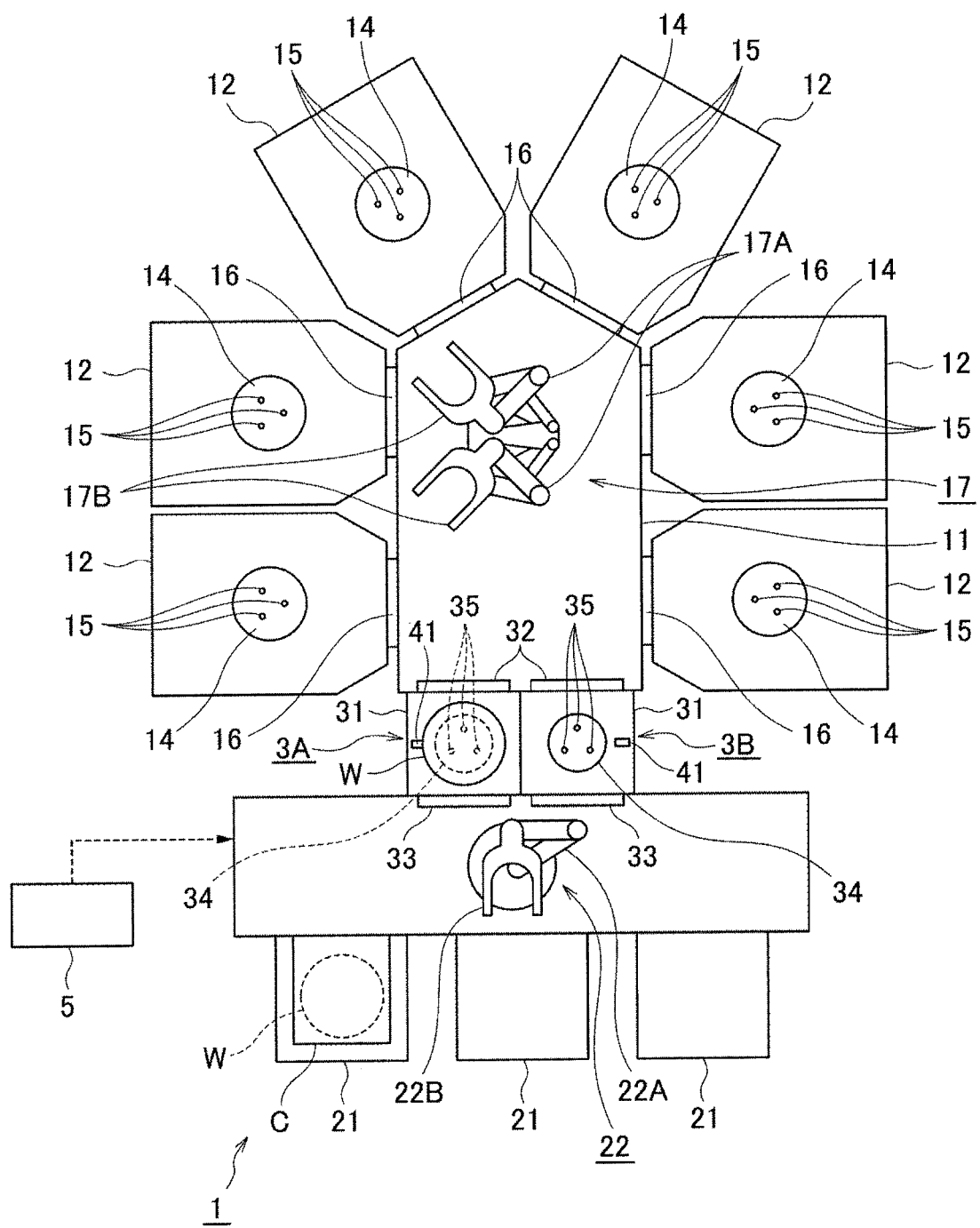
FIG. 1 is a horizontal cross sectional top view of a substrate processing apparatus including an alignment apparatus of the disclosure.

A substrate processing apparatus 1 according to an embodiment will be described with reference to the schematic top view of FIG. 1. The substrate processing apparatus 1 performs plasma treatment on wafers W one at a time. A wafer W has a diameter of, e.g., 450 mm. For example, the substrate processing apparatus 1 includes, when viewed from the top, an elongated pentagonal transfer module 11; six processing modules 12 arranged radially around the transfer module 11 and connected to the transfer module 11; a loader module 13 disposed to face the transfer module 11; and two load-lock modules 3A and 3B disposed between the transfer module 11 and the loader module 13.

Each of the processing modules 12 has a vacuum chamber. Provided in the vacuum chamber is a stage 14 (a mounting unit) for mounting thereon the wafer W. In FIG. 1, a reference numeral 15 denotes elevating pins for transferring the wafer W to and from a first wafer transfer unit 17 to be described later by elevating the wafer W from the surface of the stage 14. In each of the processing modules 12, after the wafer W is mounted on the stage 14, the inside of the vacuum chamber is set to a predetermined vacuum level. Then, a processing gas is introduced into the vacuum chamber and a high frequency power is applied into the vacuum chamber. As a consequence, a plasma is generated and the wafer W is subjected to plasma treatment such as etching or the like by the plasma thus generated. The processing modules 12 and the transfer module 11 are partitioned by openable/closable gate valves 16.

The inside of the transfer module 11 is maintained in a vacuum atmosphere. Provided in the transfer module 11 is the first wafer transfer unit 17 including two SCARA-type transfer arms 17A and a guide rail (not shown). Each of the transfer arms 17A is configured to be rotatable and extensible/contractible. An end effector 17B for mounting and holding the wafer W thereon is provided at a leading end of each transfer arm. The first wafer transfer unit 17 is configured to be movable along a lengthwise direction of the transfer module 11 along the guide rail. The first wafer transfer unit 17 is also configured to transfer wafers W between the transfer module 11, the processing modules 12, and the load-lock modules 3A and 3B.

The loader module 13 is configured as a rectangular parallelepiped transfer chamber maintained in an atmospheric atmosphere. The load-lock modules 3A and 3B are connected to one side surface of the loader module 13 which extends along the lengthwise direction. Provided at the other side surface are carrier mounting tables 21, each for mounting thereon a carrier C that is a chamber accommodating a plurality of wafers W. In this example, three carrier mounting tables 21 are provided.

Provided in the loader module 13 is a second wafer transfer unit 22 for transferring the wafer W. The second wafer transfer unit 22 includes a guide rail (not shown) and a SCARA arm type transfer arm 22A. The transfer arm 22A is configured to be movable along the lengthwise direction of the loader module 13 along the guide rail. The transfer arm 22A is also configured to be rotatable and extensible/contractible. As in the case of the first wafer transfer unit 17, the second wafer transfer unit 22 has at a leading end of the transfer arm 22A an end effector 22B for mounting and holding the wafer W. The second wafer transfer unit 22 is configured to transfer wafers W between the carrier C on the carrier mounting table 21 and the load-lock modules 3A and 3B.

Each of the load-lock modules 3A and 3B is configured as a chamber having an inner space that can be switched between a vacuum atmosphere and an atmospheric atmosphere. Further, each of the load-lock modules 3A and 3B serves as an alignment apparatus for detecting the alignment mark and the position of the circumferential edge of the wafer W and transfers the wafer W to a predetermined position on the end effector 17B of the first wafer transfer unit 17 or a predetermined position on the end effector 22B of the second wafer transfer unit 22 such that the wafer W are directed in a predetermined orientations.

Figure 2:
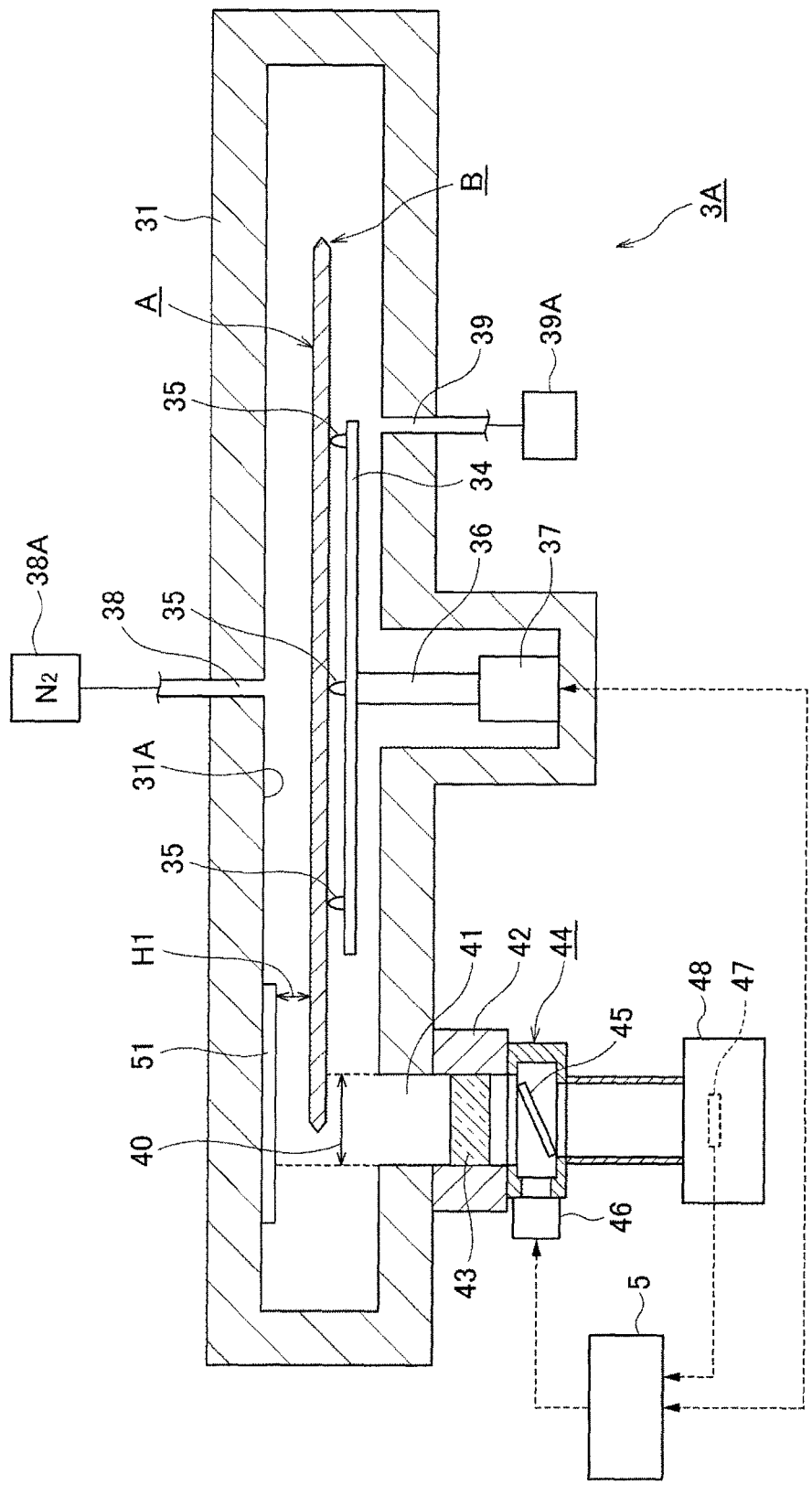
FIG. 2 is a vertical cross sectional side view of a load-lock module of the alignment apparatus according to a first embodiment.

Between the load-lock modules 3A and 3B, the load-lock module 3A will be representatively described with reference to the vertical cross sectional side view of FIG. 2. In FIG. 2, a reference numeral 31 denotes a chamber 31 of the load-lock module 3A. The chamber 31 is connected to the transfer module 11 and the loader module 13 via gate valves 32 and 33, respectively (see FIG. 1). Provided in the chamber 31 is a horizontal circular stage 34 for mounting thereon the wafer W. Three pins 35 for supporting the backside of the wafer W are provided on the surface of the stage 34. The stage 34 has a diameter smaller than a diameter of the wafer W so that the backside of the peripheral portion of the wafer W mounted on the stage 34 can be imaged. The stage 34 is connected to a driving unit 37 through a vertical shaft 36. The wafer W mounted on the stage 34 can be rotated about a vertical axis and vertically moved by the driving unit 37. The wafer W is mounted on the stage 34 such that the center of the wafer W coincides with or substantially coincides with the rotation center of the stage 34. The position of the center of the wafer W is calculated from the position of the circumferential edge of the wafer W.

A gas supply port 38 and a gas exhaust port 39 are formed at a wall of the chamber 31. For example, an $N_2$ gas supply 38A is connected to the gas supply port 38 through a gas supply line, and a gas exhaust unit 39A including a vacuum pump or the like is connected to the gas exhaust port through a gas exhaust line. The inner space of the chamber 31 can be switched between an atmospheric atmosphere and a vacuum atmosphere by the supply of $N_2$ gas through the gas supply port 38 and the gas exhaust through the gas exhaust port 39.

An opening 41 is formed at a bottom surface of the chamber 31. The opening 41 is vertically opened to face the circumferential edge of the wafer W mounted on the stage 34. At the outside of the chamber 31, a ring member 42 is provided around the peripheral edge of the opening 41. The opening of the ring member 42 is blocked by a transmission window 43 that transmits light. An optical unit 44 is provided below the ring member 42. The optical unit 44 includes a half mirror 45 and a light source 46. A camera 48 including an imaging device 47 and a lens (not shown) is connected to the bottom of the optical unit 44 so that an imaging region 40 in the chamber 31 can be imaged. The imaging direction of the camera 48, i.e., the optical axis of the lens, is directed vertically upward.

The camera 48 serving as the imaging unit is a fixed focus camera and thus has a fixed depth of field. In other words, the camera 48 is focused within a fixed predetermined vertical range in the chamber 31. Such a range includes the backside of the wafer W mounted on the stage 34. The imaging region 40 is provided, across the circumferential edge of the wafer W, in a strip shape extending in a diametrical direction of the wafer W mounted on the stage 34. In other words, a portion of the circumferential edge of the wafer W is locally imaged together with an outside region thereof. The imaging region 40 may be slightly deviated from the diametrical direction of the wafer W. When the camera 48 images the imaging region 40, a data signal including information on luminance of each location of the imaging region 40 is output from the imaging device 47 to the control unit 5. Hereinafter, the data signal is referred to as luminance data. The control unit 5 obtains an image of the imaging region 4 based on the luminance data.

More specifically, a region referred to as a beveled portion is formed at a peripheral end portion of the wafer W. For example, in FIG. 3 and the like, the beveled portion denoted by B has slanted surfaces which are respectively slanted upwardly and downwardly from the circumferential edge to the inner side of the wafer W in the top surface and the backside of the wafer W. The width of the beveled portion B in the diametrical direction of the wafer W has a tolerance of about 400 μm. For convenience of description, a flat portion positioned inner than the beveled portion B of the wafer W is referred to as a body portion A. Since, in this example, the body portion A is flat, the light irradiated from the light source 46 and incident on the body portion may be regularly reflected downward. The light irradiated from the light source 46 and incident on the slanted surfaces is regularly reflected in an inclined direction with respect to a vertical direction or a irradiating direction of the light source 46. Since the lights incident on the body portion and the slanted surfaces of the beveled portion B along the same direction are reflected in different directions, the luminance becomes lower at the beveled portion B than at the body portion A in the luminance distribution obtained by the camera 48.

The alignment mark that may be a dot-shaped laser mark which is mentioned in "Background of the Invention" is provided near the circumferential edge of the backside of the wafer W at the body portion A. The luminance of the alignment mark is lower than the neighboring luminance in the image of the backside of the body portion A which is obtained by the camera 48. For example, there are three alignment marks spaced from each other in the circumferential direction of the wafer W.

The chamber 31 has a horizontal ceiling surface 31A. A reflection part is provided at the ceiling surface 31A while being overlapped with the opening 41. In this example, the reflection part is a thin and flat reflection member 51 elongated along the diametrical direction of the wafer W. When viewed from the side, the reflection member 51 has one end positioned inner than the edge of the wafer W mounted on the stage 34 and the other end positioned outer than the edge of the wafer W. Accordingly, the reflection member 51 vertically overlaps the circumferential edge of the wafer W and the imaging region 40 of the camera 48. The reflection member 51 reflects the light irradiated from the light source 46 through the opening 41 as will be described later. The regular reflection light of the light reflected from the reflection member 51 is directed vertically downward. In the image of the wafer W and the reflection member 51 obtained by the camera 48, the luminance is higher at the reflection member 51 than at the beveled portion B. The circumferential edge of the wafer W may correspond to an outer edge of the beveled portion B, or may correspond to outer ends of the slanted surfaces of the beveled portion B. In this example, the luminance of the reflection member 51 is set to be different from that of the beveled portion B enough to easily detect the circumferential edge of the wafer W. For example, the luminance of the reflection member 51 is set to be sufficiently higher, e.g., twice higher, than that of the beveled portion B. For another example, the specular reflectance of the reflection member 51 may be set to sufficiently higher, e.g., twice higher, than that of the beveled portion B.

Next, the control unit 5 shown in FIGS. 1 and 2 will be described. The control unit 5 is a computer including a program, a CPU for performing various operations, a memory and the like. The program includes commands (steps) for transmitting a control signal to each component of the substrate processing apparatus 1 and processing and transferring the wafer W. The program is stored in a computer storage unit, e.g., a flexible disk, a compact disk, a hard disk, an MO (magneto-optical disk), a memory card or the like, and installed in the control unit 5.

Figure 3:
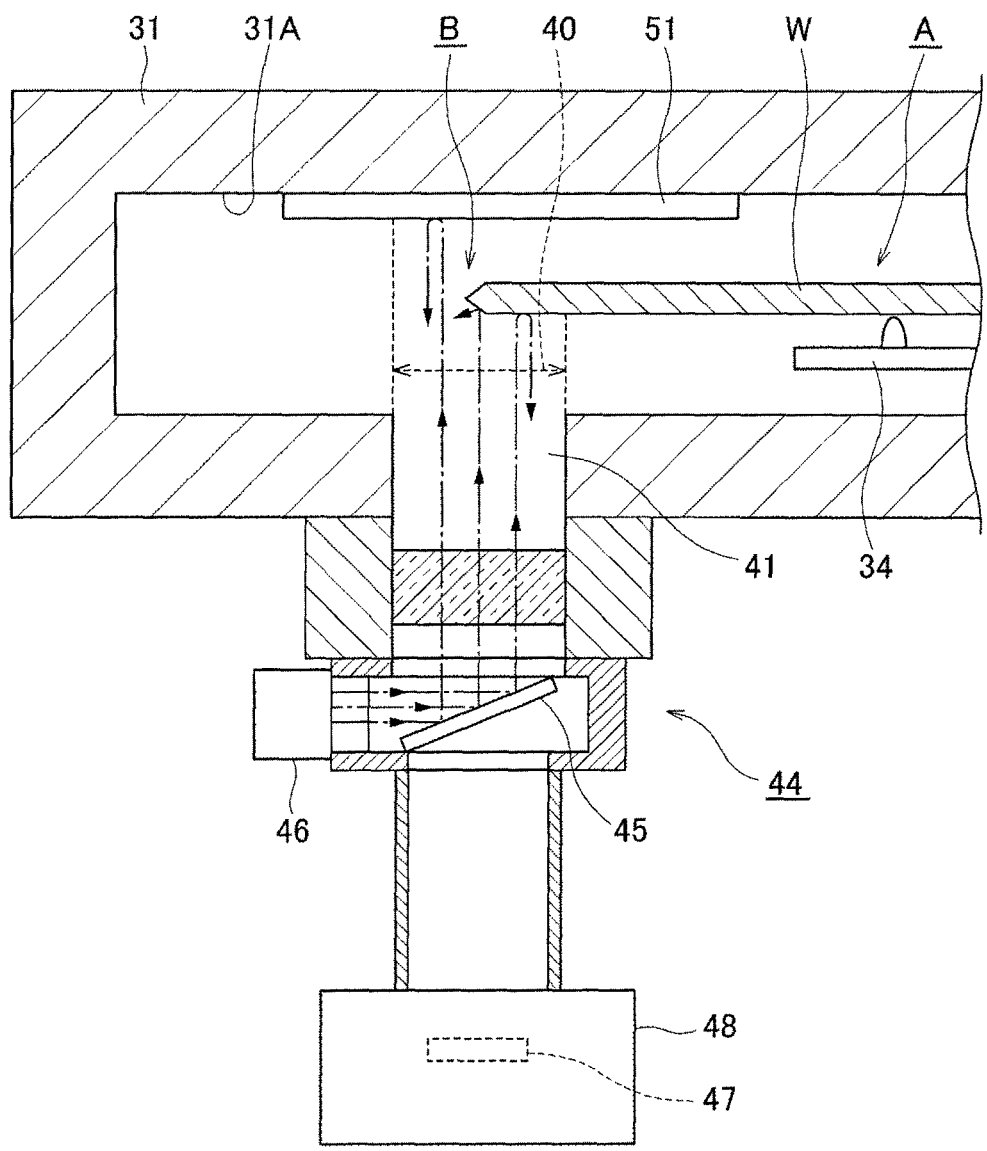
FIG. 3 explains an optical path in the load-lock module.

After the alignment mark and the circumferential edge of the wafer W transferred to the load-lock module 3A are detected, the wafer W is transferred to the end effector 17B of the first wafer transfer unit 17. The detection of the alignment mark and the circumferential edge of the wafer will be described with reference to FIG. 3. In FIG. 3, the optical paths of the light irradiated from the light source 46 are indicated by arrows. In a state where the wafer W is mounted on the stage 34, the light from the light source 46 is irradiated sideward in the optical unit 44. Then, the light is reflected by the half mirror 45 and directed vertically upward. Next, the light is irradiated to the peripheral portion of the backside of the wafer W mounted on the stage 34 and to the outside of the wafer W. At the beveled portion B of the wafer W, a comparatively small amount of light is reflected vertically downward. On the other hand, at the body portion A, a comparatively large amount of light is regularly reflected vertically downward. The light irradiated from the half mirror 45 to the outside of the wafer W is directed vertically downward by the regular reflection of the reflection member 51.

Figure 4:
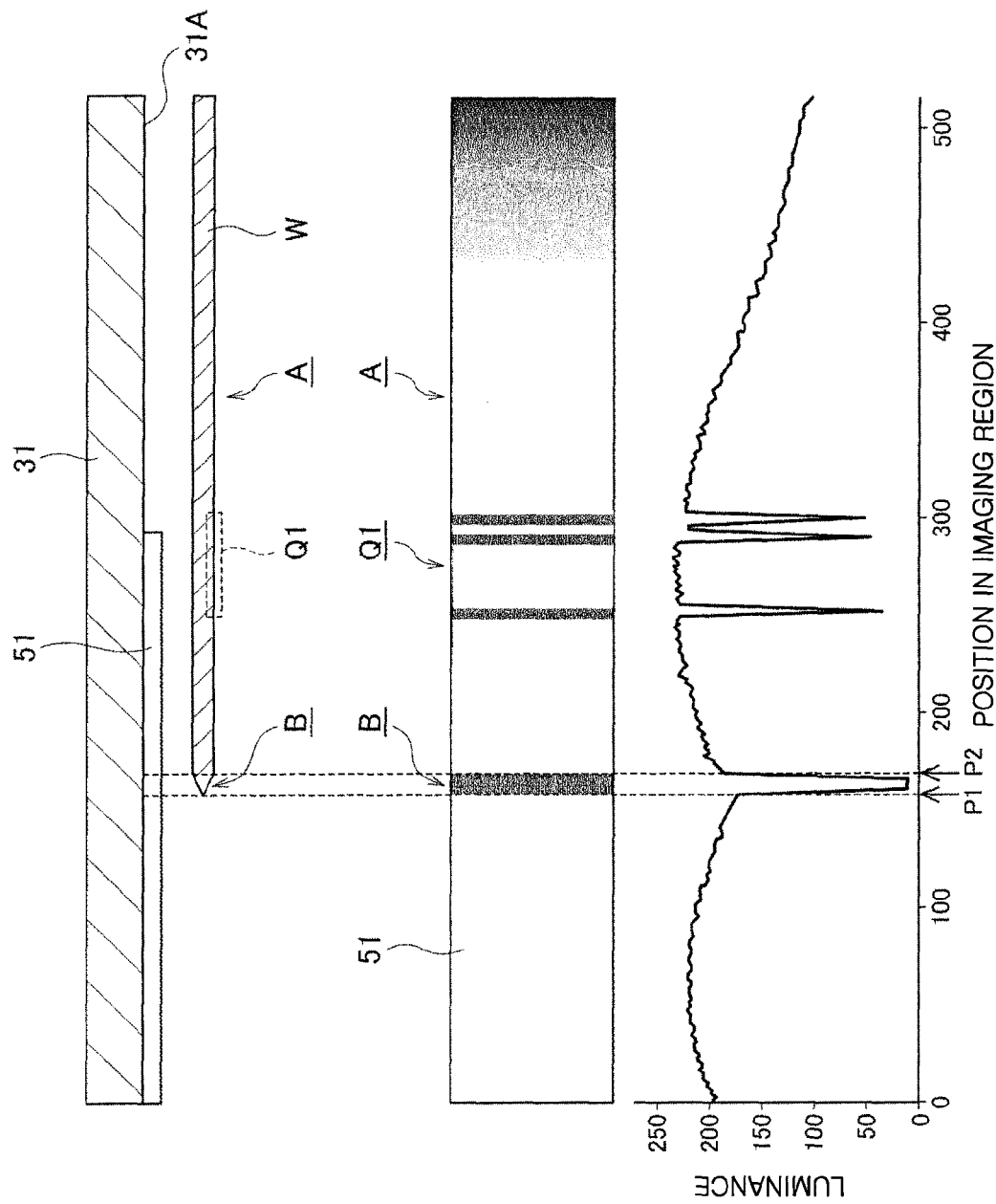
FIG. 4 explains relation between an acquired image, a luminance distribution graph, and a position of a beveled portion of a wafer in the load-lock module of the first embodiment.

In a state where the light irradiated from the light source 46 is reflected by the wafer W and the reflection member 51, the imaging region 40 is imaged by the camera 48 and the obtained luminance data is transmitted to the control unit 5. FIG. 4 explains relation between the image, the graph obtained from the luminance data, and the wafer W. A lengthwise direction of the image shown in the intermediate part of FIG. 4 (right-left direction in FIG. 4) corresponds to the diametrical direction of the wafer W. The vertical axis of the graph shown in the lower part of the FIG. 4 represents the luminance of the image. As a numerical value in the vertical axis increases, the luminance of the image becomes higher. A numerical value in the horizontal axis of the graph represents a position in the image region 40 in the diametrical direction of the wafer W. Therefore, positions in the horizontal axis correspond to positions in the lengthwise direction of the image. A numerical value of zero in the horizontal axis of the graph corresponds to one end of the outside of the wafer W in the imaging region 40. A larger numerical value in the horizontal axis indicates an inner position of the wafer W. Hereinafter, a graph of a luminance distribution pattern in the imaging region 40, such as the graph in the lower part of FIG. 4, will be referred to as a luminance distribution graph.

Since the reflection member 51 and the backside of the wafer W may be partially included in the imaging region 40, the obtained luminance data shows the luminance distribution in such a region. In this luminance distribution, the luminance of the beveled portion B of the wafer W is lower than that of the reflection member 51 and that of the body portion A positioned inner than the beveled portion B as described above. Therefore, when the waveform of the luminance distribution graph of FIG. 4 is viewed toward the inner side of the wafer W, the luminance decreases abruptly at a certain point. The position of the imaging region which corresponds to such a point is set to P1. When the waveform of the graph is viewed toward the outside of the wafer W, the luminance decreases abruptly at a certain point. The position of the imaging region which corresponds to such a point is set to P2. The position P1 is positioned outer than the position P2. The luminance viewed from the position P1 toward the position P2 has a waveform that is abruptly decreased and maintained at a comparatively low level and then abruptly increased. The control unit 5 detects such a waveform and detects the position P1 as the position of the circumferential edge of the wafer W.

The image and the luminance distribution graph of FIG. 4 show the case of imaging the alignment mark (denoted by Q1). At the body portion A, the luminance of the alignment mark Q1 is lower than the neighboring luminance. Therefore, in the luminance distribution graph, the alignment mark Q1 is obtained as a plurality of steep peaks. The control unit 5 detects the alignment mark from the waveform of the graph, for example. Although there is a plurality of, e.g., three, alignment marks Q1, the control unit 5 can distinguish the alignment marks Q1 due to different gaps between the peaks. After the alignment marks Q1 are detected, the control unit 5 can control the orientation of the stage 24 such that the alignment marks Q1 are directed in predetermined orientations.

Hereinafter, the operation in the load-lock module 3A will be described. As described above, the luminance data of the entire circumference of the wafer W is obtained by rotating the stage 34 once while irradiating the light from the light source 46. In the luminance data of the entire circumference, the position P1 where the waveform of the graph decreases is detected as described in the luminance distribution graph of FIG. 4. Then, the central position of the wafer W and the eccentric amount between the central position of the wafer W and the rotation center of the stage 34 are calculated based on the detected positon P1 in the entire circumference of the wafer W. The alignment mark Q1 is detected from the luminance data and the stage 34 is rotated such that the alignment mark Q1 is directed in a predetermined orientation. After the orientation of the wafer W is adjusted, the rotation of the stage 34 is stopped.

Based on the calculated central position of the wafer W and/or the calculated eccentric amount, the end effector 17B is moved to the backside of the wafer W such that the center of the wafer W is positioned at a predetermined position on the end effector 17B of the first wafer transfer unit 17. Then, the stage 34 is lowered and the wafer W whose orientation has been adjusted is received by the end effector 17B.

Next, an example of transferring the wafer W in the entire substrate processing apparatus 1 will be described. In this example, the load-lock module 3A is used as a module for loading the wafer W into the transfer module 11, and the load-lock module 3B is used as a module for unloading the wafer W from the transfer module 11. A wafer W in the carrier C is transferred into the loader module 13 by the second wafer transfer unit 22 and then transferred to the load-lock module 31 having an inner space maintained in an atmospheric atmosphere. In the load-lock module 3A, the chamber 31 is exhausted from the gas exhaust port 39 in order to maintain the inner space of the chamber 31 in a predetermined vacuum atmosphere. In addition, the aforementioned operations such as the detection of the circumferential edge of the wafer W, the calculation of the central position of the wafer W and the eccentric amount, and the detection of the alignment mark Q1, are performed.

Next, based on the detection result, the wafer W is transferred to the first wafer transfer unit 17 and then to the processing module 12. As the wafer W whose orientation and position received by the end effector 17B have been controlled in the load-lock module 3A, the wafer W can be transferred to a predetermined position in the processing module 12 to direct in a predetermined orientation and then subjected to an etching process. The processed wafer W is transferred to the first wafer transfer unit 17 and then to the load-lock module 3B having the chamber 31 maintained in the vacuum atmosphere. N₂ gas is supplied into the chamber 31 in order to set the inner space of the chamber 31 to the atmospheric atmosphere. Next, the wafer W is transferred to the second wafer transfer unit 22 and then returns to the carrier C.

In the above example, the operations performed in the load-lock module 4A, such as the detection of the alignment mark Q1 and the circumferential edge of the wafer W, and the calculation of the central position of the wafer W and the eccentric amount, are not performed in the load-lock module 3B. However, the detection of such parameters and the above calculation may be performed while changing the pressure in the load-lock module 3B, for example. In that case, the wafer W is mounted in a predetermined position on the end effector 22B of the second wafer transfer unit 22 to direct in a predetermined orientation based on the detection result and the calculation result.

In the load-lock modules 3A and 3B of the substrate processing apparatus 1, the light is irradiated to the circumferential edge of the wafer W and the backside of the wafer W is imaged by the optical unit 44 and the camera 48 used for detecting the alignment mark Q1 as described above. Since there is provided the reflection member 51 for reflecting the light that is irradiated to the top surface side of the wafer W while passing through the outside of the wafer W toward the imaging region 40, the luminance of the outside of the wafer W becomes higher than the luminance of the beveled portion B of the wafer W in the luminance distribution pattern obtained by the camera 48. Accordingly, the circumferential edge of the wafer W can be detected with high accuracy. Further, since the central position of the wafer W or the eccentric amount between the central position of the wafer W and the rotation center of the wafer W are obtained from the detected circumferential edge of the wafer W, the wafer W can be mounted in a predetermined position on the end effector 17B of the first wafer transfer unit 17 with high accuracy based on the calculated central position and the calculated eccentric amount. As a result, the wafer W can be transferred to the predetermined position in the processing module 12 with high accuracy, which results in the improvement of the processing accuracy of the wafer W.

Second Embodiment

Figure 5:
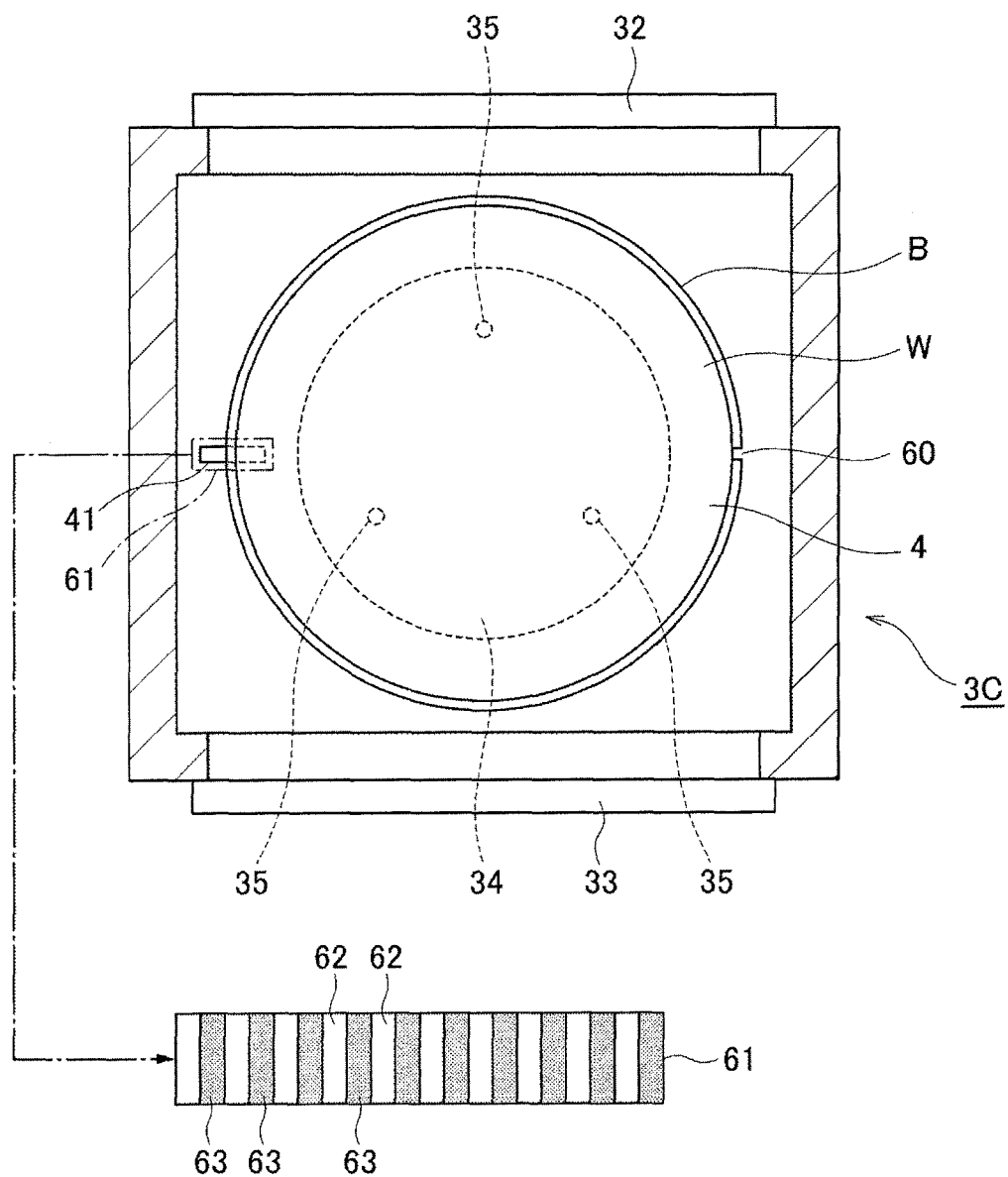
FIG. 5 is a horizontal cross sectional top view of a load-lock module according to a second embodiment.
Figure 6:
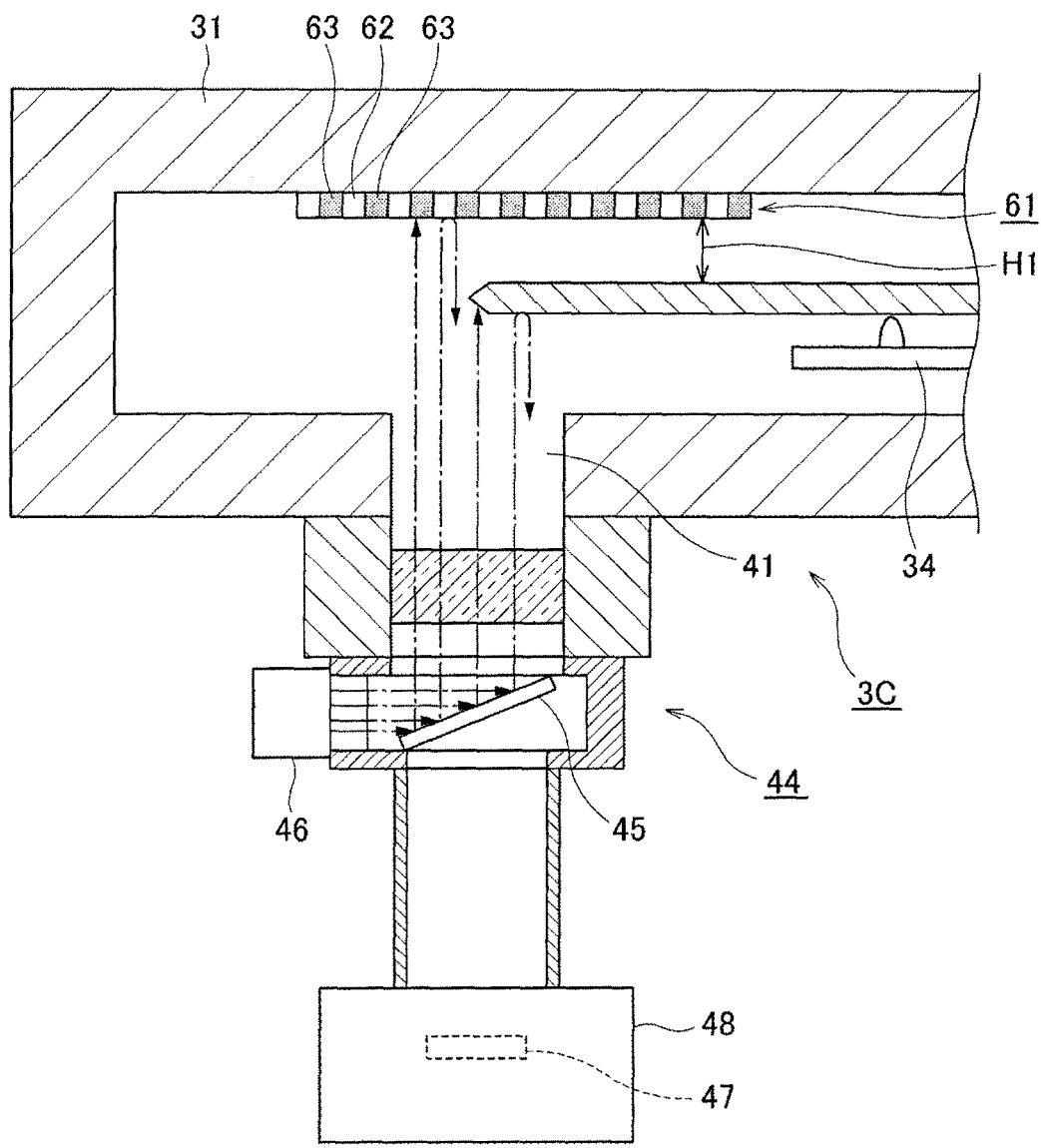
FIG. 6 explains an optical path in the load-lock module.

Next, the difference between the load-lock module 3C of the second embodiment and the load-lock modules 3A and 3B will be described with reference to the horizontal cross sectional top view of FIG. 5 and the vertical cross sectional side view of FIG. 6. The beveled portion B of the wafer W may have a cutout portion because it has a thickness smaller than that of the body portion A. In FIG. 5, a reference numeral 60 denotes the cutout portion. In the load-lock module 3C, the circumferential edge of the wafer W can be detected even when the cutout portion 60 is formed.

In the load-lock module 3C, a reflection member 61 is provided, instead of the reflection member 51, at the ceiling surface 31A. In FIG. 5, a lower surface of the reflection member 61 is shown at the end of a long dotted arrow. The lower surface of the reflection member 61 is formed by alternately arranging rectangular reflection regions 62 and 63 along the diametrical direction of the wafer W. The reflection regions 62 and 63 have different reflectances (e.g., specular reflectances). As will be described later, the specular reflectance of the light from the light source 46 by the reflection region 62 is set to be higher than that of the light by the reflection region 63 by, e.g., about 50% or above, in order to form a pattern that allows the circumferential edge of the wafer W to be detected based on the luminance distribution graph even when the beveled portion B has a cutout portion. More specifically, the specular reflectance of the light by the reflection region 62 is, e.g., about 75% or above, and the specular reflectance of the light by the reflection region 63 is, e.g., about 10% or less. In the obtained image, the reflection regions 62 and 63 are formed such that the luminance of the reflection regions 62 and 63 becomes higher than that of the beveled portion B of the wafer W and lower than that of the body portion A of the wafer W.

Figure 7:
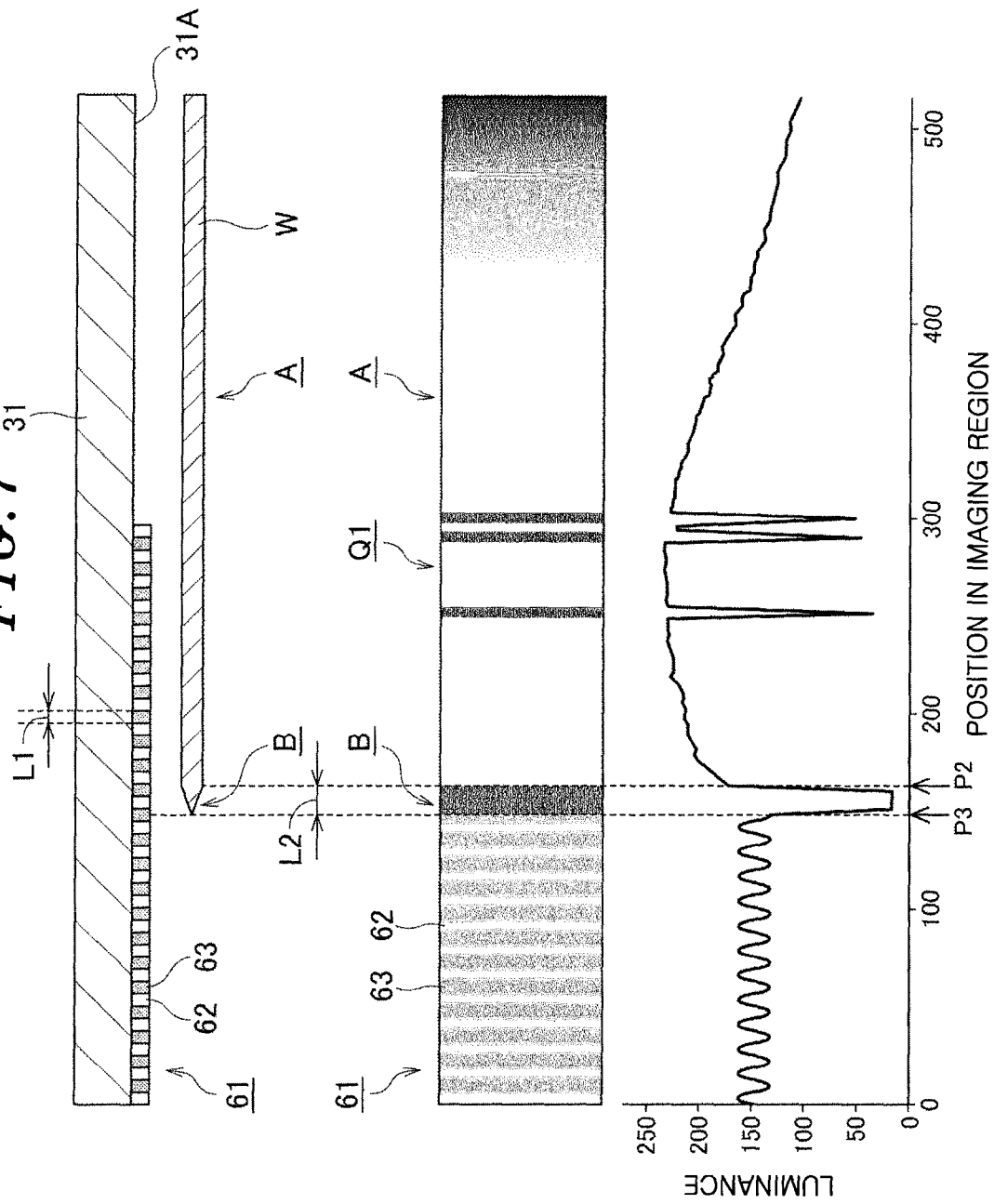
FIGS. 7 and 8 explain relation between an acquired image, a luminance distribution graph, and a position of a beveled portion of a wafer in the load-lock module of the second embodiment.

The camera 48 is focused on the backside of the wafer W without being focused on the reflection member 61. In other words, the reflection member 61 is positioned outside the depth of field of the camera 48, so that the image of the reflection member 61 is blurry. A distance H1 between the top surface of the wafer W and the lower surface of the reflection member 61 which is shown in FIG. 6 is, e.g., about 10 mm. FIG. 7 shows the luminance distribution graph and the image obtained from the luminance data obtained by imaging the imaging region 40. As illustrated in the upper part of FIG. 7, the luminance data used for the luminance distribution graph and the image of FIG. 7 are obtained by imaging a location of the wafer W where the cutout portion 60 is not formed at the beveled portion B.

Due to the above-described arrangement of the reflection regions 62 and 63, the obtained image has a comparatively high luminance region corresponding to the reflection region 62 and a comparatively low luminance region corresponding to the reflection region 63 which are alternately repeated at the outside of the wafer W in the imaging region 40. Since the reflection member 61 is positioned outside the depth of field as described above, the luminance is gradually changed from one region toward the other region at the boundary of the reflection regions 62 and 63. As a result, the waveform of the luminance distribution graph becomes a regularly changing waveform, e.g., a sine wave shown in FIG. 7.

As described above, the luminance of the reflection regions 62 and 63 is higher than that of the beveled portion B. Therefore, when the luminance distribution graph is viewed from the outer side toward the inner side of the wafer W, the luminance decreases so that the transition of the sine wave is broken at the circumferential edge of the wafer W. A position of the imaging region which corresponds to the point where the transition of the sine wave is broken is set to P3. At the portion of the wafer W which is positioned inner than the position P3, the waveform of the graph corresponds to the luminance distribution of the body portion A and the beveled portion B of the wafer W. In other words, when viewed toward the inner side of the wafer W, the luminance abruptly decreases at the position P3 and is maintained at a comparatively low level. Then, the luminance abruptly increases and is maintained at a comparatively high level. As described with reference to FIG. 4, the position P2 in the graph corresponds to the boundary between the beveled portion B and the body portion A. The luminance is abruptly changed at the position P2.

The sine wave obtained by the reflection regions 62 and 63 is restricted to the outside region of the wafer W and is not shown at the locations corresponding to the body portion A and the beveled portion B of the wafer W in the imaging region 40. Therefore, the control unit 5 detects the position P3, as the position of the circumferential edge of the wafer W, from the disconnection of the sine wave.

Next, the luminance distribution graph and the image obtained from the luminance data obtained by imaging the location of the wafer W where the cutout portion 60 is formed at the beveled portion B will be described with reference to FIG. 8. In this example, the cutout portion 60 extends from the original circumferential edge of the wafer W to the outer circumference of the body portion A as shown in FIG. 5. As described above, the luminance of the body portion A is higher than that of the reflection regions 62 and 63. Therefore, when the imaging region 40 is viewed toward the inner side of the wafer W, the waveform of the luminance distribution graph increases substantially vertically at a point where the pattern of the sine wave obtained by the reflection regions 62 and 63 is disconnected. The position of the imaging region which corresponds thereto is set to P4. At the portion of the wafer W which is positioned inner than the position P4, the waveform corresponds to the luminance distribution of the body portion A of the wafer W. In other words, when viewed toward the inner side of the wafer W, the luminance increases at the position P4 and is maintained at a comparatively high level. Since the sine wave is restricted to the outer region of the wafer W, even if the cutout portion 60 is formed, the control unit 5 can detect the position P4, as the position of the circumferential edge of the wafer W, from the disconnection of the sine wave.

When the cutout portion 60 does not reach the inner end of the beveled portion B, i.e., when the beveled portion B is partially cutout in the vertical cross sectional side view, the waveform of the luminance distribution graph obtained by imaging the circumferential edge of the wafer W is substantially the same as that shown in FIG. 7. In that case, the control unit 5 can detect the position 3 where the sine wave is disconnected as the circumferential edge of the wafer W. In other words, the control unit 5 can detect the circumferential edge of the wafer W based on the disconnection of the sine wave regardless of the size of the cutout portion 60. Due to the presence of the cutout portion 60, the gap between the position P3 and the position P2 in the luminance distribution graph becomes smaller than that in the graph of FIG. 7.

As in the case of the load-lock module 3A, in the load-lock module 3C, the stage 34 on which the wafer W is mounted is rotated once while irradiating the light from the light source 46. Accordingly, the control unit 5 detects the alignment mark Q1 and the position of the circumferential edge in the entire circumference of the wafer W. Further, the control unit 5 obtains an outer shape of the wafer W from the position of the circumferential edge. As a consequence, the region where the cutout portion 60 is formed is specified. The central position of the wafer W and the eccentric amount between the central position of the wafer W and the rotation center of the wafer W are calculated based on the position of the circumferential edge of the wafer W which is detected in the region except the specified region.

The load-lock module 3C is provided, instead of the load-lock module 3A, at the substrate processing apparatus 1. Accordingly, the transfer of the wafer W to the end effector 17B of the first wafer transfer unit 17 is carried out based on the central position of the wafer W and the eccentric amount. Since the central position of the wafer W is specified based on the position of the circumferential edge which is detected in the region except the region where the cutout portion 60 is formed, the wafer W can be transferred to a predetermined position of the end effector 17B with high accuracy.

In the load-lock module 3C, the outer shape of the wafer W is obtained, so that it is possible to detect the number of cutout portions at the circumferential edge of the wafer W or the state of the cutout portions at the circumferential edge of the wafer W, such as the area of the cutout portions or the like. Therefore, in the substrate processing apparatus 1 including the load-lock module 3C, if it is determined by the control unit 5 that the number of cutout portions and/or the area of the cutout portions is greater than a tolerance level, the wafer W may be returned to the carrier C via the transfer module 11 and the load-lock module 3B without being transferred to the processing module 12.

In the load-lock module 3C, the reflection member 61 is provided to form a regular pattern at the outside of the wafer W. Thus, the circumferential edge of the wafer W is obtained based on the position where the regular pattern is disconnected in the luminance distribution graph. As described above, the pattern is curved and changed to a linear or a substantially linear waveform at the position P3 where the pattern is disconnected. In other words, the shape of the waveform is clearly changed at the circumferential edge of the wafer W. Therefore, the control unit 5 can accurately distinguish the boundary. In other words, the control unit 5 can accurately detect the circumferential edge of the wafer W.

As shown in FIG. 7, when the luminance distribution graph is viewed in the diametrical direction of the wafer W, the waveform has a pattern that is decreased and then increased at the region corresponding to the beveled portion B. The waveform of the graph obtained by the reflection member 61 is a sine wave and thus has a pattern that is decreased and then increased when viewed in the diametrical direction of the wafer W. In the reflection member 61, the width of the reflection region 63 having a comparatively low luminance in the width direction of the wafer W is set such that the shape of the waveform can be clearly distinguished by the control unit 5. Specifically, a width L1 of the reflection region 63 is set to be different from a width L2 of the beveled portion B as shown in FIG. 7. FIG. 7 shows an example in which the width L2 of the reflection region 63 is set to be smaller than the width L2 of the beveled portion B.

Figure 8:
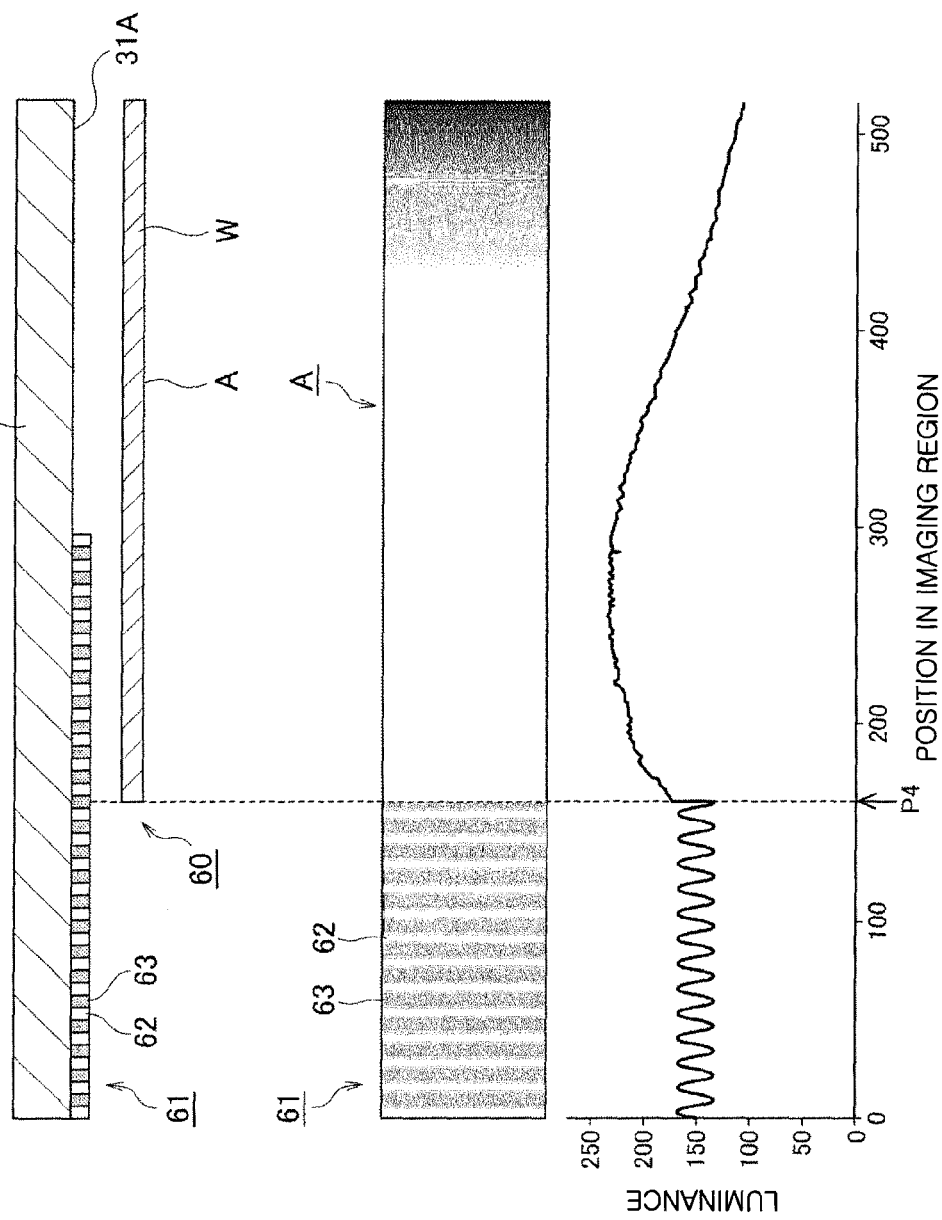
Figure 9:
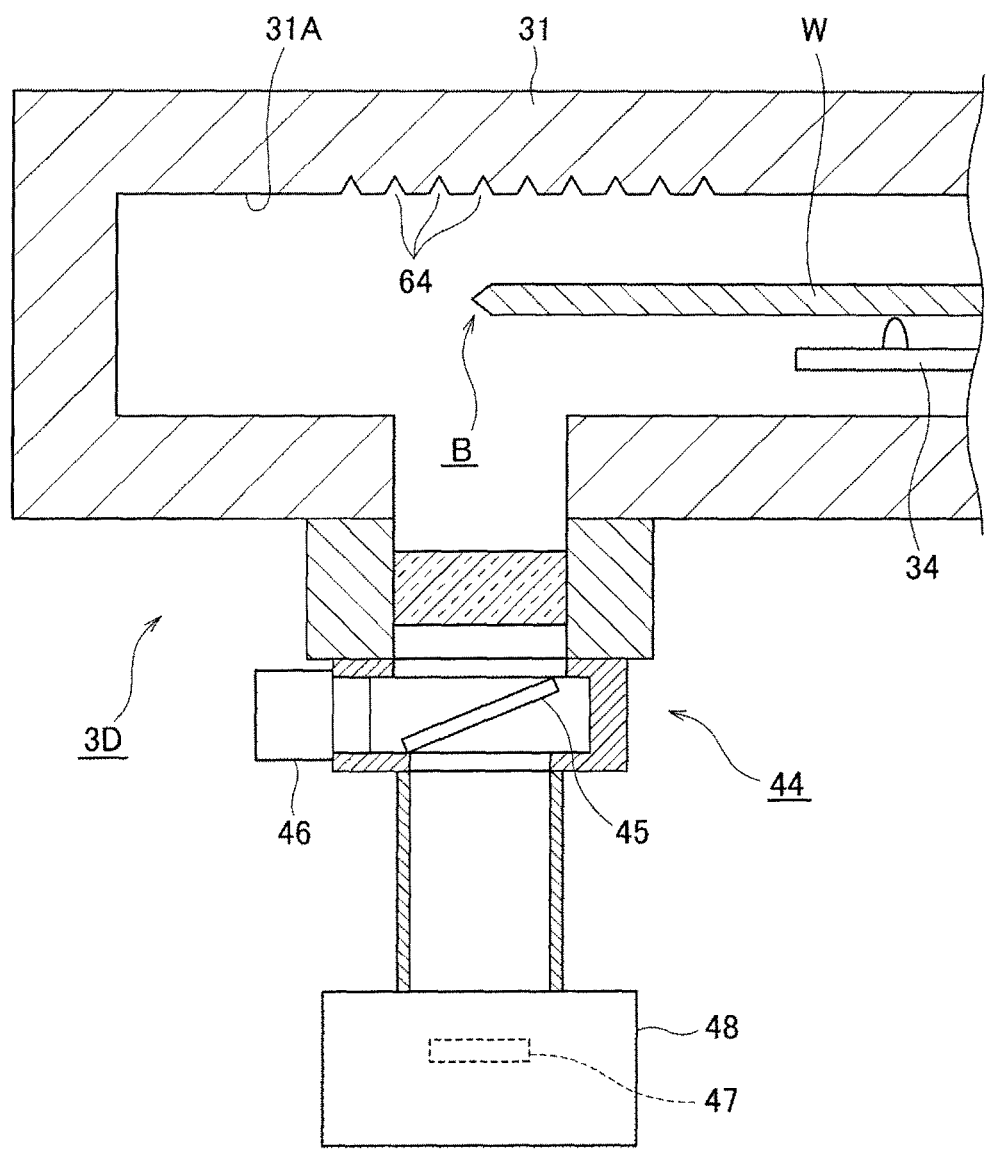
FIG. 9 is a vertical cross sectional side view of a load-lock module according to a third embodiment.

FIG. 9 shows a load-lock module 3D according to a third embodiment. In this embodiment, the reflection part is not a member such as the reflection members 51 and 61 in the above embodiments. In the load-lock module 3D, the chamber 31 serves as the relfection part. For example, the ceiling surface 31A of the chamber 31 is formed as a mirror surface. The specular reflectance of the light from the light source 46 at the ceiling surface 31A is set to be about 75% or above as in the case of the reflection region 62 of the reflection member 61. At the ceiling surface 31A, a plurality of grooves 64 is formed at a regular interval along the diametrical direction of the wafer W. Each of the grooves 64 extends in a tangential direction of the wafer W. The specular reflectance of the light from the light source 46 at the grooves 64 may be about 10% or less as in the case of the reflection region 63 of the reflection member 61. With such a configuration, the pattern of the sine wave shown in FIGS. 7 and 8 is obtained in the luminance distribution graph. Therefore, in the load-lock module 3D as well as the load-lock module 3C, the central position of the wafer W can be obtained with high accuracy by detecting the cutout portion formed at the beveled portion B.

Figure 10:
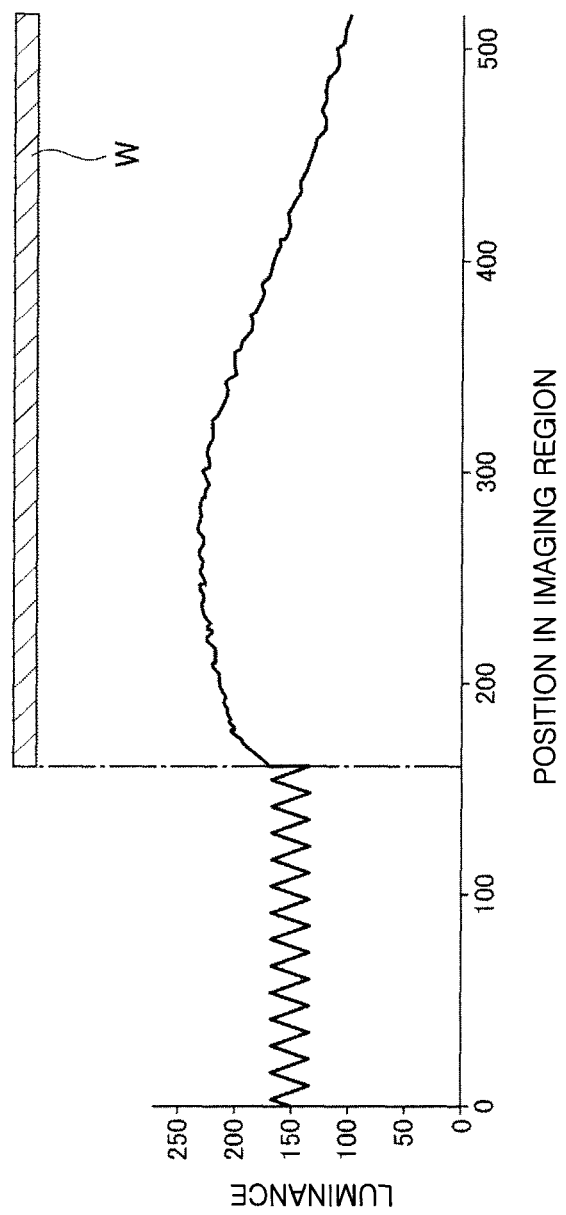
FIG. 10 is a graph showing a modification of a waveform of a pattern.

The waveform corresponding to the outside of the wafer W in the luminance distribution graph does not necessarily have a pattern of a sine wave as long as the circumferential edge of the wafer can be detected by the control unit 5. For example, a regular pattern of a triangular wave corresponding to the outside of the wafer W shown in FIG. 10 may be formed. Since a waveform having high verticality compared to the regular pattern of the triangular wave is shown at the position corresponding to the circumferential edge of the wafer W, the control unit 5 can detect the circumferential edge of the wafer W based on the waveform of the graph. The pattern at the outside of the wafer W allows the control unit 5 to perform accurate detection. Therefore, the pattern may be slightly distorted and irregular within a range that can be detected by the control unit 5.

Figure 11:
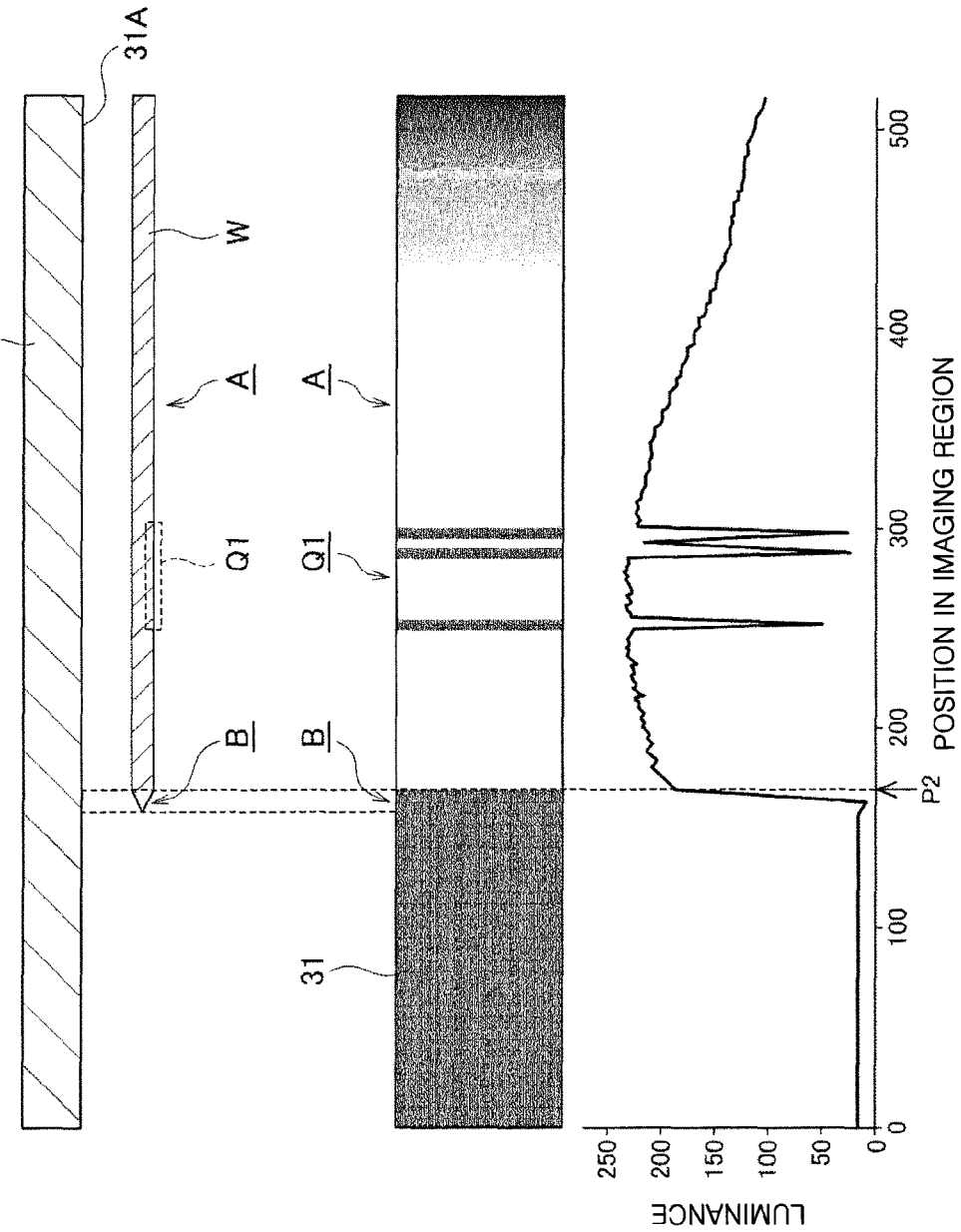
FIG. 11 explains relation between an acquired image, a luminance distribution graph, and a position of a beveled portion of a wafer in a load-lock module of comparative example 1.

Hereinafter, a load-lock module of a comparative example will be explained in order to describe the effect of the load-lock modules of the above embodiments in detail. The load-lock module of the comparative example 1 has the same configuration as that of the load-lock module 3A except that the reflection member 51 is not provided. The ceiling surface 31A of the chamber 31 has a large absorptivity of the light from the light source 46 compared to the reflection member 51. FIG. 11 shows the luminance distribution graph and the image obtained based on the luminance data in the load-lock module of the comparative example 1.

In the comparative example 1, compared to the image obtained in the load-lock module 3A, the luminance of the ceiling surface 31A is low and the luminance difference between the beveled portion B and the ceiling surface 31 is small due to the large light absorptivity of the ceiling surface 31A. In the luminance distribution graph of the comparative example 1, there is not detected a waveform that is abruptly decreased at a position corresponding to the circumferential edge of the wafer W which is shown in the luminance distribution graph of the load-lock module 3A. Therefore, in the comparative example 1, the circumferential edge of the wafer W cannot be detected.

In the waveform of the luminance distribution graph of the comparative example 1 as well as the waveform of the luminance distribution graph of the load-lock module 3A, the luminance is abruptly decreased at the position P2 corresponding to the boundary between the beveled portion B and the body portion A. Therefore, it is possible to preset the width of the beveled portion B and estimate the position of the circumferential edge of the wafer W based on the detected position P2 and the width of the beveled portion B. Since, however, the width of the beveled portion B has a tolerance as described above, it is difficult to make the estimated position of the circumferential edge coincide with the actual position of the circumferential edge. Further, even when the cutout portion 60 is formed at the beveled portion B, it is difficult to determine whether or not the cutout portion 60 exists. Thus, in the load-lock module 3A, the position of the circumferential edge can be detected more accurately, compared to the comparative example 1.

In the load-lock module of the comparative example 2, a light source 65 serving as a transmission illumination of the wafer W is provided at the ceiling portion of the chamber 31. When the wafer W is imaged, the light is irradiated to the wafer W from both of the light sources 65 and 46. The light from the light source 65 is irradiated toward the imaging region 40 of the camera 48. A wavelength (hereinafter, referred to as "first wavelength") of the light irradiated from the light source 46 disposed below the wafer W is different from a wavelength (hereinafter, referred to as "second wavelength") of the light irradiated from the light source 65 provided at the ceiling portion. As for the imaging device 47 of the camera 48, there is used one capable of distinguishing the first wavelength and the second wavelength as well as obtaining the luminance distribution of the imaging region 40.

Figure 12:
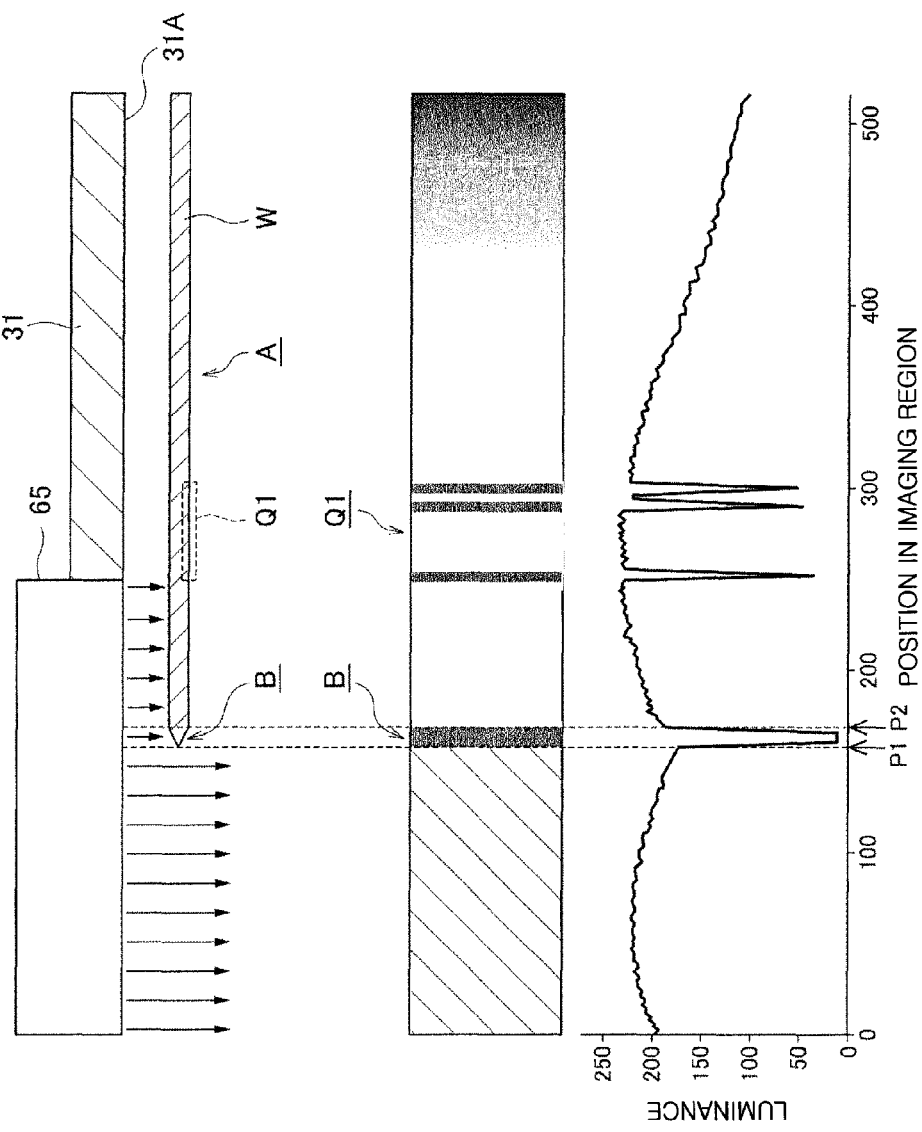
FIG. 12 explains relation between an acquired image, a luminance distribution graph, and a position of a beveled portion of a wafer in a load-lock module of comparative example 2.

FIG. 12 shows the luminance distribution graph and the image obtained based on the luminance data obtained in the load-lock module of the comparative example 2. Due to the difference in the wavelengths of the light sources 46 and 65, the image of the region to which the light from the light source 65 is irradiated in the imaging region 40, i.e., the image of the outside of the wafer W is obtained as an image having a different color (different wavelength) from that of the image of the body portion A of the wafer W. In FIG. 12, the image of the outside of the wafer W is shaded in order to express the color difference.

In the load-lock module of the comparative example 2, when the region of the wafer W where the cutout portion 60 is not formed is imaged, a luminance distribution graph having the same waveform as that of the luminance distribution graph obtained in the load-lock module 3A is obtained as shown in FIG. 12. In other words, as described in the luminance distribution graph of FIG. 4, there are detected the positions P1 and P2 respectively corresponding to the position of the circumferential edge of the wafer W and the boundary between the beveled portion B and the body portion A where the luminance abruptly decreases. The luminance distribution at the outer side than the position P1 in the imaging region 40 is obtained by the irradiation of the light from the light source 65 disposed above the wafer W. The luminance distribution at the inner side than the position P2 is obtained by the irradiation of the light from the light source 46 disposed below the wafer W.

In the load-lock module of the comparative example 2, when the region where the cutout portion 60 extends from the original circumferential edge of the wafer W toward the outer end of the body portion A as shown in FIG. 8 is imaged, the decrease of the luminance at the position corresponding to the circumferential edge of the wafer W and the decrease of the luminance at the position corresponding to the boundary between the beveled portion B and the body portion A are not detected in the obtained luminance distribution graph. In other words, the circumferential edge of the wafer W cannot be detected from the luminance distribution graph. However, the imaging device 47 can distinguish the wavelengths of the light from the light sources 46 and 65, so that it is possible to detect, as the position of the circumferential edge of the wafer W, the position where the wavelengths are switched when the imaging region 40 is viewed in the diametrical direction of the wafer W. In other words, in the load-lock module of the comparative example 2 as well as the load-lock module 3C, the position of the circumferential edge of the wafer W can be detected with high accuracy even when the cutout portion 60 is formed at the circumferential edge of the wafer W. However, in the comparative example 2, it is required to provide a high-cost light source 65 as a transmission illumination and use as the imaging device 47 one capable of distinguishing two different wavelengths. Therefore, the load-lock module 3C is more advantageous compared to the load-lock module of the comparative example 2 in that the circumferential edge of the wafer W can be detected by a cost-effective configuration.

While the disclosure has been shown and described with respect to the embodiments, it will be understood by those skilled in the art that various changes and modifications may be made without departing from the scope of the disclosure as defined in the following claims.

What is claimed is:

1. An alignment apparatus for aligning a wafer that is a circular substrate mounted on a mounting unit in a predetermined orientation by optically detecting an alignment mark formed at a backside of the wafer by rotating the mounting unit, the apparatus comprising:
   an imaging unit configured to image, from a position below the wafer, an imaging region having a strip shape extending in a diametrical direction of the wafer across a circumferential edge of the wafer;
   an irradiation unit configured to irradiate light from a position below the wafer toward the imaging region;
   a reflection part configured to reflect toward the imaging region the light that is irradiated from the irradiation unit upwardly while passing through an outside of the wafer, the reflection part having a reflectance making a luminance difference between the outside of the wafer corresponding to the reflection part and the circumferential edge of the wafer in a luminance distribution pattern, obtained by imaging the imaging region, in the diametrical direction of the wafer; and
   a control unit configured to detect the alignment mark and the circumferential edge of the wafer based on the luminance distribution pattern.

2. The alignment apparatus of claim 1, wherein a peripheral end portion of the wafer has a slanted surface with respect to the light irradiated from the irradiation unit, and the reflection part has the reflectance which makes the luminance of the outside of the wafer be higher than the luminance of the circumferential edge of the wafer corresponding to an outer end of the slanted surface in the diametrical direction of the wafer.

3. The alignment apparatus of claim 1, wherein the reflection part is formed such that a regular luminance distribution pattern is obtained at a region corresponding to the outside of the wafer in the imaging region.

4. The alignment apparatus of claim 3, wherein the regular luminance distribution pattern is a sine wave.

5. The alignment apparatus of claim 1, wherein the reflection part has a first reflection region and a second reflection region which have different specular reflectances, and
   wherein the first reflection region and the second reflection region are alternately provided along the diametrical direction of the wafer.

6. The alignment apparatus of claim 1, further comprising:
   a chamber configured to accommodate the wafer mounted on the mounting unit therein, and provided with a thin and flat reflection member, as the reflection part, elongated along the diametrical direction of the wafer; and
   a rotation unit configured to rotate the mounting unit to move the imaging region along a circumference of the wafer for imaging an alignment mark formed on a backside of the wafer.

7. The alignment apparatus of claim 1, further comprising a chamber configured to accommodate the wafer mounted on the mounting unit therein, wherein the reflection part includes a plurality of grooves formed in an inner surface of the chamber facing the imaging region.

8. The alignment apparatus of claim 1, wherein the control unit detects a region where a cutout portion is formed at the circumferential edge of the wafer and detects a central positon of the wafer based on a position of the circumferential edge of the wafer which is detected in a region except the region where the cutout portion is formed.

* * * * *